United States Patent
Grand et al.

(10) Patent No.: US 10,725,440 B1
(45) Date of Patent: Jul. 28, 2020

(54) SYSTEMS AND METHOD FOR PARAMETER ESTIMATION FOR A PERMANENT MAGNET SYNCHRONOUS MACHINE

(71) Applicant: The MathWorks, Inc., Natick, MA (US)

(72) Inventors: Kerry E. Grand, Chesterfield, MI (US); Yang Xu, Northville, MI (US); Ebrahim M. Mestchian, Newton, MA (US)

(73) Assignee: The MathWorks, Inc., Natick, MA (US)

( * ) Notice: Subject to any disclaimer, the term of this patent is extended or adjusted under 35 U.S.C. 154(b) by 446 days.

(21) Appl. No.: 15/443,646

(22) Filed: Feb. 27, 2017

Related U.S. Application Data

(60) Provisional application No. 62/300,154, filed on Feb. 26, 2016.

(51) Int. Cl.
*G06F 30/30* (2020.01)
*H02P 6/34* (2016.01)
(Continued)

(52) U.S. Cl.
CPC ............ *G05B 13/048* (2013.01); *G06F 30/20* (2020.01); *G06F 30/30* (2020.01); *H02P 6/34* (2016.02);
(Continued)

(58) Field of Classification Search
None
See application file for complete search history.

(56) References Cited

U.S. PATENT DOCUMENTS

| | | | |
|---|---|---|---|
| 6,163,128 A | * | 12/2000 | Hiti ................... B60L 15/025 318/722 |
| 6,954,050 B2 | * | 10/2005 | Tobari ................... H02P 6/18 318/453 |

(Continued)

OTHER PUBLICATIONS

K. H. Kim, G. W. Moon, and M. J. Youn, "Parameter Estimation and control for permanent manget synchronous motor drive using model reference adaptive technique" 1995 IEEE, pp. 387-392 (Year: 1995).*

(Continued)

*Primary Examiner* — Kibrom K Gebresilassie
(74) *Attorney, Agent, or Firm* — Cesari and McKenna, LLP

(57) ABSTRACT

Embodiments include techniques for estimating unknown or missing values for parameters of a motor based on high-level motor information and using the estimated parametric values in generating an executable model for modeling the behavior of the motor. An aspect of the techniques involves assumptions used to establish the predetermined parametric values that are applied to the algorithm for deriving estimates of the unknown parametric values for the motor. The estimated parametric values may then be used in the executable model of the motor to enable development and simulation of a plant (e.g., a closed loop system) including a plant model having a dynamic controller model and a lumped parameter model of a modeling environment of a technical computing environment executing on a data processing system. The simulation of the plant loop can be sufficient to test the dynamic (e.g., feedback-based) controller within a closed loop system, e.g., test motion control of a motorized vehicle seat.

34 Claims, 9 Drawing Sheets

(51) Int. Cl.
*G05B 13/04* (2006.01)
*G06F 30/20* (2020.01)
*G07B 17/00* (2006.01)
*G06F 30/17* (2020.01)
*H02P 21/22* (2016.01)

(52) U.S. Cl.
CPC .............. *G06F 30/17* (2020.01); *G07B 17/00* (2013.01); *H02P 21/22* (2016.02)

(56) References Cited

U.S. PATENT DOCUMENTS

| | | | | |
|---|---|---|---|---|
| 7,969,112 | B2* | 6/2011 | Piippo | H02P 21/13 318/609 |
| 8,829,831 | B2* | 9/2014 | Yoo | H02P 21/16 318/400.02 |
| 2005/0007044 | A1* | 1/2005 | Qiu | H02P 21/13 318/400.02 |
| 2006/0279248 | A1* | 12/2006 | Borisavljevic | H02P 11/06 318/723 |
| 2008/0265823 | A1* | 10/2008 | Piippo | H02P 21/13 318/609 |
| 2012/0194113 | A1* | 8/2012 | Lee | H02P 6/18 318/400.33 |
| 2013/0093370 | A1* | 4/2013 | Yoo | H02P 21/16 318/400.02 |
| 2013/0221885 | A1* | 8/2013 | Hunter | H02P 21/0003 318/400.15 |
| 2015/0372629 | A1* | 12/2015 | Huang | H02P 21/13 318/400.02 |

OTHER PUBLICATIONS

A. Wang, X. Jia, W. Shi, "On-line Parameter Estimation Method for IPMSM based on Decoupling Control", pp. 610-616, 2010. (Year: 2010).*

K. H. Kim, S. K. Chung, G. W. Moon, I. C. Baik, M. J. Youn, (Herein referred as Kim et al), "Parameter Estimation and Control for Permanent Magnet Synchronous Motor Drive Using Model Reference Adaptive Technique" pp. 387-392, 1995 IEEE.*

Apte, Aishwarya, et al., "Simulation of a Permanent Magnet Synchronous Motor using Matlab-Simulink," IEEE, 2014 Annual IEEE India Conference (INDICON), Dec. 11-13, 2014, pp. 1-5.

Arroyo, Enrique L. Carrillo, "Modeling and Simulation of Permanent Magnet Synchronous Motor Drive System," Thesis, Master of Science in Electrical Engineering, University of Puerto Rico Mayagüez Campus, 2006, pp. 1-106.

Hieb, Brad, "Creating a High-Fidelity Model of an Electric Motor for Control System Design and Verification," The MathWorks, Inc., Sep. 2013, pp. 1-10.

Lai, Chiu-Keng, et al., "Modeling, Analysis, and Realization of Permanent Magnet Synchronous Motor Current Vector Control by MATLAB/Simulink and FPGA," MDPI, Machines, Journal, 5(24), 26, Oct. 2017, pp. 1-14.

Mirahki, Hooshang, "Torque Calculation in Interior Permanent Magnet Synchronous Machine Using Improved Lumped Parameter Models," Progress in Electromagnetics Research M., vol. 39, Oct. 2014, pp. 131-139.

"Permanent Magnet Synchronous Machine," The MathWorks, Inc., Retrieved from: < https://www.mathworks.com/help/physmod/sps/powersys/ref/permanentmagnetsynchronousmachine.html ?requestedDomain=www.mathworks.com>, Feb. 1, 2017, pp. 1-15.

"SimPowerSystems™: User's Guide (Simscape™ Components)," R2015b, The Math Works, Inc., Sep. 2015, pp. 1-64.

"SpiceMod: The SPICE Modeling Spreadsheet," Intusoft, Retrieved from: <http://www.intusoft.com/spicemod.htm>, Retrieved on Feb. 26, 2017, pp. 1-6.

Thornton, Edward J., et al., "The Fundamentals of AC Electric Induction Motor Design and Application," Proceedings of 20th International Pump Users Symposium, Houston, TX, Mar. 17-20, 2003, pp. 95-106.

* cited by examiner

SYSTEMS AND METHOD FOR PARAMETER ESTIMATION FOR A PERMANENT MAGNET SYNCHRONOUS MACHINE

CROSS-REFERENCE TO RELATED APPLICATIONS

The present application claims the benefit of U.S. Provisional Patent Application Ser. No. 62/300,154, filed Feb. 26, 2016, by Kerry Grand and Yang Xu for PARAMETER ESTIMATION FOR A PERMANENT MAGNET SYNCHRONOUS MACHINE, which is hereby incorporated by reference in its entirety.

BRIEF DESCRIPTION OF THE DRAWINGS

Advantages of embodiments of the disclosure may be better understood by referring to the following description in conjunction with the accompanying drawings in which like reference numerals indicate identically or functionally similar elements, of which.

DESCRIPTION OF ILLUSTRATIVE EMBODIMENTS

Figure 1:
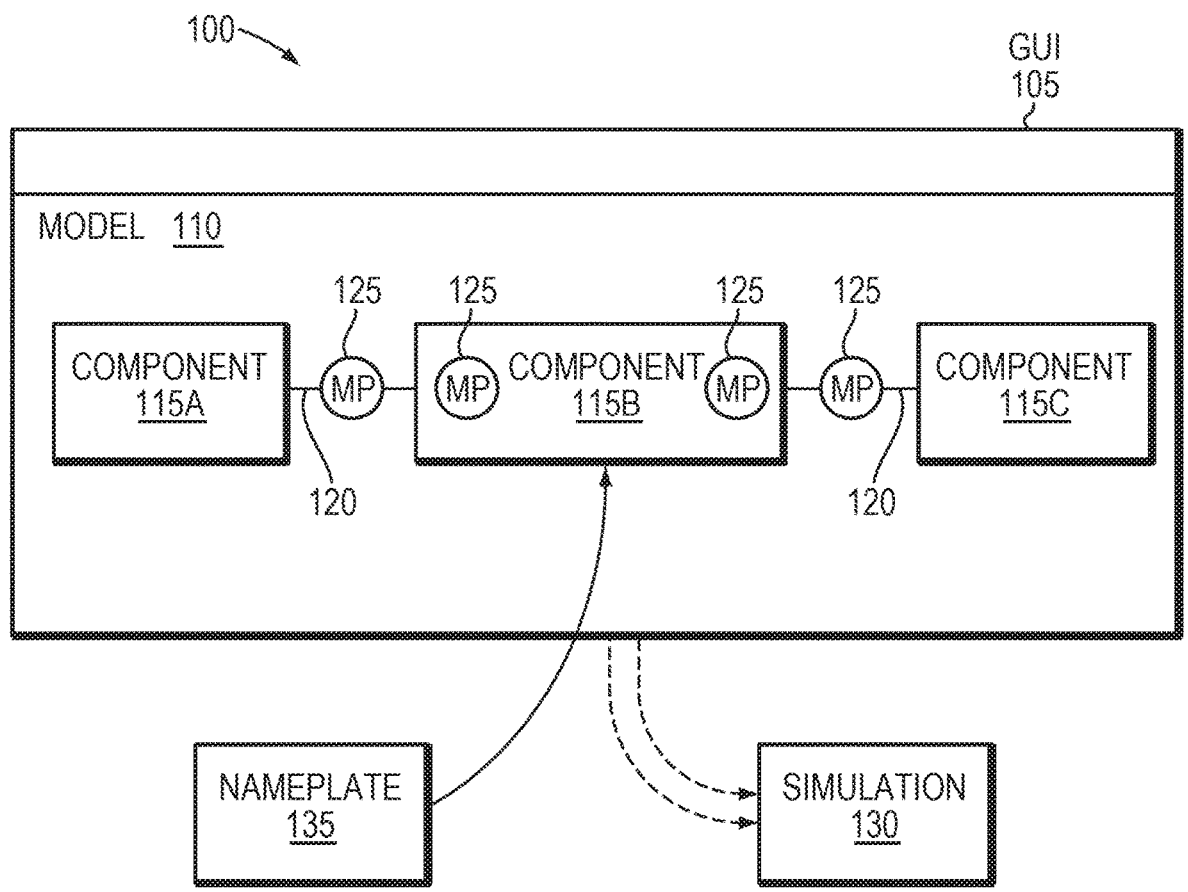
FIG. 1 is a diagram of an example modeling environment in accordance with an embodiment.

Embodiments include techniques for estimating unknown or missing values for parameters (or parametric values) and using the estimated parametric values in generating an executable model for modeling the behavior of a motor, e.g., a motor of a vehicle. In some implementations, the motor is a permanent magnetic synchronous motor (PMSM). The estimations can be performed in a non-iterative manner. The executable model may be a lumped parameter model for the motor, which may also be referred to as a "motor model". The unknown or missing parameter values (or parametric values) may be estimated from one or more known, e.g., predetermined, parametric values of the motor, e.g., power, rated speed, and torque. The one or more known, e.g., predetermined, parametric values of the motor may be obtained from initial high level motor information, for example a motor nameplate, datasheets, etc.

In some implementations, one or more algorithms are used in deriving the unknown or missing parametric values based on the known, e.g., predetermined, parametric values for the motor that may be received via a graphical user interface. In some implementations, the one or more algorithms are non-iterative. An aspect of the techniques may also involve assumptions, such as the load on the motor, its angular velocity, and/or the voltage and/or current supplied to the motor, used to establish one or more of the predetermined parametric values that are applied to the one or more algorithms for deriving (e.g., generating) estimates of the unknown parametric values for the motor. The estimated parametric values may then be used in a model of the motor, such as a lumped parameter model, to enable development and simulation of a system (e.g., a closed loop system), which may include a dynamic (e.g., feedback-based) controller model and the lumped parameter model of the motor. The system model may be created in a modeling environment of a technical computing environment (TCE) executing on a data processing system. Simulation of the system model by the modeling environment can be sufficient to refine and/or test the dynamic controller model. The system model may further include a model of a load on the motor model, and the motor model and load model may together be referred to as a plant model. In one example, the system model may be used to evaluate and test the motion control of a motorized vehicle seat.

The one or more algorithms enable creation and execution of a motor model, for example the lumped parameter model, of sufficient fidelity to support the design, evaluation, and testing of a dynamic controller model within a system model, for example a system model of a closed system. In some embodiments, code may be generated for the system model or portions thereof, such as for the controller model. Code generated for the controller model for example may be used to operate or configure a physical controller operating on a physical plant.

In some embodiments, the motor may include an interior permanent magnet, a surface-mounted permanent magnet, or a brushless direct current (DC) motor. In some embodiments, the motor is a permanent magnet synchronous motor (PMSM). The initial high-level motor information may include, e.g., specify, predetermined parametric values for power, rated speed, torque, or DC bus voltage for the motor (PMSM) model. In some implementations, in addition to known parametric values, including power, rated speed, and torque, unknown parametric values such as d-axis inductance ($L_d$), q-axis inductance ($L_q$), magnetic flux ($\lambda_{pm}$) or stator resistance ($R_s$) for the PMSM model are estimated and one or more of these estimated parametric values are used for generating the PMSM model. In some implementations, using at least two of the known parametric values, all unknown parametric values of the motor can be estimated.

The techniques may obtain data, e.g., known parametric values, from one or more lookup tables and may perform estimations, e.g., linear estimations, of one or more unknown parameters from the data. In some embodiments, the techniques may transform the organization of a memory of the data processing device for example from a table-centric modeling environment to a model structured modeling environment to thereby improve simulation of a system model by a modeling environment executing on the data processing system. The techniques can have utility in estimating parameters in the presence of magnetic saturation of the PMSM. In some embodiments, one or more of the unknown or missing parameters (parametric values) may be parameters or settings of the lumped parameter model.

In some implementations, the information about the motor can include operational quantities, e.g., time-varying values during actual operation of the motor, design quantities (e.g., quantities that are limits imposed on proper operation of the motor), and parameters. The operational and design quantities can include mechanical forces, e.g., power (P), torque (T), velocities (ω), etc., and electromagnetic, e.g., voltage (V), current (I), etc. The parameters can include (1) dynamic parameters that describe the dynamics of the motor or a motor model, which can include inductances, stator resistance ($R_s$), permanent magnetic flux ($\lambda_{pm}$), and rotor inertia (J), (2) geometric parameters that captures geometry of the motor, which can include sizes, shapes, curvatures, etc., (3) performance parameters, including efficiencies, National Electrical Manufacturers Association (NEMA) data, duty, heat generation, etc., (4) behavioral parameters, e.g., maximum, minimum, frequencies, etc., and (5) nameplate parameters. Categorizations of quantities and parameters can also be found in E. Thornton et al. *The Fundamentals of AC Electric Induction Motor Design and Application*, Proceedings of $20^{th}$ International Pump Users Symposium, Houston, Tex. (Mar. 17-20, 2003), the content of which is incorporated herein by reference in its entirety.

The high level motor information and/or the known, e.g., predetermined, parameters or quantities can include one or more of the above categorized quantities or parameters. The techniques can estimate unknown or missing values of one type of parameter based on one or more known values of quantities or different types of parameters.

In some implementations, the techniques can estimate unknown or missing values of one category of parameter, for example dynamic parameters, based on one or more known values of quantities or parameters that are of different categories, for example nameplate parameters or design quantities, from the one having values estimated.

Example Computing Environment

FIG. 1 is a diagram of an example modeling environment 100. The modeling environment 100 may include a graphical user interface (GUI) 105, and an executable model 110 that includes components 115A-115C, connector lines 120, and measurement points (MPs) 125. Through the GUI 105, a user can interact with a technical computing environment (TCE) (400 at FIG. 4) to create the model 110 and to simulate the model 110, as indicated generally at 130. The model 110 may provide a visual and/or functional representation of a system, a device, a process, an operation, a feature, or a mechanism corresponding to a discipline or a domain (e.g., mathematics, science, engineering, medicine, economics, business, etc.). For example, model 110 may correspond to an electrical circuit, a hydraulic system, an internal combustion engine, or a permanent magnet motor. The components 115A-115C may represent physical parts across multiple domains, such as electrical (e.g., circuits, power electronics, etc.), mechanical, optical, hydraulic (e.g., pumps, etc.), electromechanical (e.g., pumps), magnetic, biomechanical, and algorithmic/computer-controlled parts. The model components 115A-115C may be blocks. The model 110 can also include other modeling elements, such as labels, lines, annotations, etc.

Each component 115A-115C may perform a function depending on a nature of the component (e.g., hardware device, a system, a subsystem, etc.) being modeled and the model 110 as a whole. Connector lines 120 may represent data, control, signals, events, state transitions, or physical constraints in the case of a model of a physical system having physical connections. A device, such as a data processing system, may execute the model 110 in one or many simulation loops. The measurement points 125 may enable measurements to be taken with respect to a function, a process, an operation, a behavior, or another type of characteristic of a given component or a group of components. For example, where a component corresponds to an electrical circuit component, the measurement points 125 may enable a user to take a measurement corresponding to an electrical current, an electrical potential, an electrical resistance, an electrical continuity, or another type of characteristic of a component. In some implementations, such measurements may be performed during a simulation of the model 110.

In some implementations, the high-level motor information may be extracted or obtained from manufacturer-provided materials, such as datasheets or a motor nameplate 135 of a physical motor being modeled, such as a permanent magnetic synchronous motor (PMSM), among others.

Figure 2:
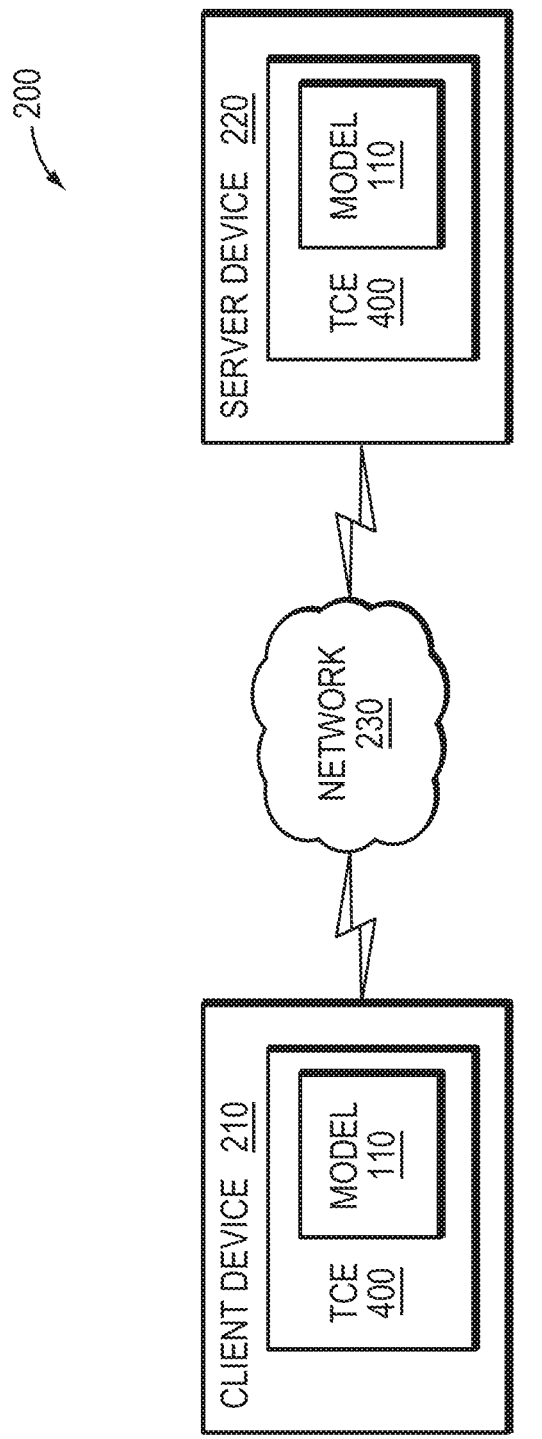
FIG. 2 is a diagram of an example environment in which systems and/or methods described herein may be implemented.

FIG. 2 is a diagram of an example environment 200 in which a system, such as a dynamic physical system, may be modeled by a TCE 400. The model 110 may be executed to simulate the system in order to generate a result. The TCE 400 may provide a graphical modeling environment (e.g., a block diagram environment) that generates the model 110 including components 115A-115C having modifiable assigned data (e.g., parametric values.) The environment 200 may include a client device 210 interconnected with a server device 220 via a network 230. Components of environment 200 may interconnect via wired and/or wireless connections. A single client device 210, a single server device 220, and a single network 230 are illustrated for simplicity. In other embodiments, the environment 200 may include more client devices 210, server devices 220, and/or networks 230. In some implementations, the client device 210 and the server device 220 may be provided in a single device or may be provided in separate devices. Although example components of environment 200 are illustrated, in other implementations, environment 200 may include fewer components, different components, differently arranged components, and/or additional components than those depicted in FIG. 2.

The client device 210 may include one or more devices that are capable of communicating with the server device 220 via the network 230. For example, the client device 210 may include a data processing system, a laptop computer, a personal computer, a tablet computer, a desktop computer, a workstation computer, a smart phone, a personal digital assistant (PDA), and/or other computation and communication devices.

The server device 220 may include one or more server devices, or other types of computation and communication devices, that gather, process, and/or provide information in a manner described herein. The server device 220 may include a device that is capable of communicating with the client device 210 via the network 230. The server device 220 may include one or more data processing systems, laptop computers, personal computers, workstation computers, servers, central processing units (CPUs), graphical processing units (GPUs), application-specific integrated circuits (ASICs), field-programmable gate arrays (FPGAs), etc. and/or software (e.g., a simulator) executing on the aforementioned devices. The server device 220 may include the TCE 400 and may perform some or all of the functionality described herein for client device 210. Alternatively, the server device 220 may be omitted, and the client device 210 may perform all of the functionality described herein for the client device 210.

The network 230 may include a local area network (LAN), a wide area network (WAN), a metropolitan area network (MAN), a virtual private network (VPN), a telephone network, such as the Public Switched Telephone Network (PSTN), an intranet, the Internet, or a combination of networks. The network 230 may be a communication network that includes digital and/or analog aspects. Information exchanged in the network 230 may include machine-readable information having a format that may be used, for example, in network 230, with one or more components in the network 230 (e.g., switches, routers, gateways, etc.) and/or with devices coupled to the network 230, such as the client device 210 and the server device 220. For example, network information may be encapsulated in one or more packets that may be used to transfer the information through the network 230. Information may be exchanged between components in the network 230 using various communication protocols, such as, but not limited to, the Internet Protocol (IP), Asynchronous Transfer Mode (ATM), Synchronous Optical Network (SONET), the User Datagram Protocol (UDP), Transmission Control Protocol (TCP), Institute of Electrical and Electronics Engineers (IEEE) 802.11, or other communication protocols.

Portions of the network 230 may be wired (e.g., using wired conductors, optical fibers, wave guides, etc.) and/or wireless (e.g., using free-space optical (FSO), radio frequency (RF), acoustic transmission paths, etc.). It should be noted that implementations of communication networks and/or devices operating on communication networks described herein are not limited with regards to, for example, information carried by the communication networks, protocols used in the communication networks, and/or the architecture/configuration of the communication networks.

The TCE 400 may be provided within a computer readable medium of the client device 210. Alternatively, or additionally, the TCE 400 may be provided in another device (e.g., the server device 220) that is accessible by the client device 210. The TCE 400 may include hardware or a combination of hardware and software that provides a computing environment that allows users to perform tasks related to disciplines, such as, but not limited to, mathematics, science, engineering, medicine, business, etc., more efficiently than if the tasks were performed in another type of computing environment, such as an environment that required the user to develop code in a conventional programming language, such as C++, C, Fortran, Pascal, etc. In some implementations, the TCE 400 may include a dynamically-typed and/or array-based programming language (e.g., the M language, a MATLAB® language, a MATLAB-compatible language, a MATLAB like language, etc.) that can be used to express problems and/or solutions in mathematical notations.

For example, the TCE 400 may use an array as a basic element, where the array may not require dimensioning. These arrays may be used to support array-based programming where an operation may apply to an entire set of values included in the arrays. Array-based programming may allow array-based operations to be treated as high-level programming that may allow, for example, operations to be performed on entire aggregations of data without having to resort to explicit loops of individual non-array operations. In addition, the TCE 400 may be adapted to perform matrix and/or vector formulations that can be used for data analysis, data visualization, application development, simulation, modeling, algorithm development, etc. These matrix and/or vector formulations may be used in many areas, such as statistics, image processing, signal processing, control design, life sciences modeling, discrete event analysis and/or design, state based analysis and/or design, etc.

The TCE 400 may further provide mathematical functions and/or graphical tools (e.g., for creating plots, surfaces, images, volumetric representations, or other representations, etc.). In some implementations, the TCE 400 may provide these functions and/or tools using toolboxes (e.g., toolboxes for signal processing, image processing, data plotting, parallel processing, etc.) suitable for use by non-professional programmers. Alternatively, or additionally, the TCE 400 may provide these functions as block sets or in another way, such as via a library, etc. example, via a library, local or remote database (e.g., a database operating in a computing cloud), remote procedure calls (RPCs), and/or an application programming interface (API). Examples of graphically-based modeling environments that may be suitable for use in the methods and systems described herein include: Simulink® software, Stateflow® software, SimEvents® software, Simscape" software, etc., by The MathWorks, Inc.; VisSim by Visual Solutions; LabView® by National Instruments; Dymola by Dynasim; SoftWIRE by Measurement Computing; WiT by DALSA Coreco; VEE Pro or SystemVue by Agilent; Vision Program Manager from PPT Vision; Khoros from Khoral Research; Gedae by Gedae, Inc.; Scicos from The French Institution for Research in Computer Science and Control (INRIA); Virtuoso from Cadence; Rational Rose from IBM; Rhopsody or Tau from Telelogic; SystemModeler from Wolfram; and Ptolemy from the University of California at Berkeley. Such systems may employ physical network approaches and may include sets of block libraries and special simulation features for modeling physical components interconnected in order to form one or more systems.

A physical network approach is particularly suited for simulating systems that include dynamic physical components. A dynamic system (either natural or man-made) is a system whose response at any given time is a function of its input stimuli, its current state, and the current time. Physical dynamic systems include, for example, a falling body, the rotation of the earth, bio-mechanical systems (e.g., muscles, joints and the like), bio-chemical systems (gene expression, protein pathways), weather and climate pattern systems, a bouncing ball, a spring with a mass tied on an end, electrical or fluidic or optical systems, automobiles, airplanes, control systems in major appliances, communication networks, audio signal processing, nuclear reactors, a stock market, a motorized car seat utilizing a PMSM motor, a power window, etc. Physical network modeling environments permit creation of network representations of systems under design. An executable block diagram model of a physical system may be represented schematically as a collection of blocks interconnected by lines that represent constraints on physical values such as voltages or pressures.

The physical network approach may compute physical operating values resulting from physical equations that are well-known or developed by users. Information may be propagated and stored in the model using "across" (or equivalently "potential" variables) and "through" (or equivalently "flow") variables. To ensure conservation of physical values, a model solver may require an algebraic sum of "through" variables, such as mass (e.g., fluid) flow, electrical current, heat flow, mechanical torque or power flux, to be zero at connecting nodes.

The physical network may comprise any component, structure, mechanism, or device having physical attributes that can be modeled. Describing the physical component by defining a model element can include programmatically, computationally, mathematically and/or behaviorally defining the model element. Connections to the model element describing the physical component can be non-directional or non-causal. The physical component and its associated physical behavior may be functionally defined. Therefore, the structure of the physical component as represented by the model element can be defined at compile time based on parameters and behavior statements. The structure of the physical component as represented by the model element may also vary before, during, or after model execution. For example, the structure may be configured by a user or by an automated script, and may be altered prior to simulation, or may change during simulation.

In addition to the graphically-based modeling environments noted above, the TCE 400 may be implemented as a text-based environment (e.g., MATLAB® software; Simscape; Octave; Python; Comsol Script; MATRIXx from National Instruments; Mathematica from Wolfram Research, Inc.; Mathcad from Mathsoft Engineering & Education Inc.; Maple from Maplesoft; Extend from Imagine That Inc.; Scilab from The French Institution for Research in Computer Science and Control (INRIA); Virtuoso from Cadence; Modelica or Dymola from Dynasim; etc.); aspects of a Unified Modeling Language (UML) or SysML environment; etc.); or another type of environment, such as a hybrid environment that includes one or more text-based environments and one or more graphically-based environments.

Example Device Architecture

Figure 3:
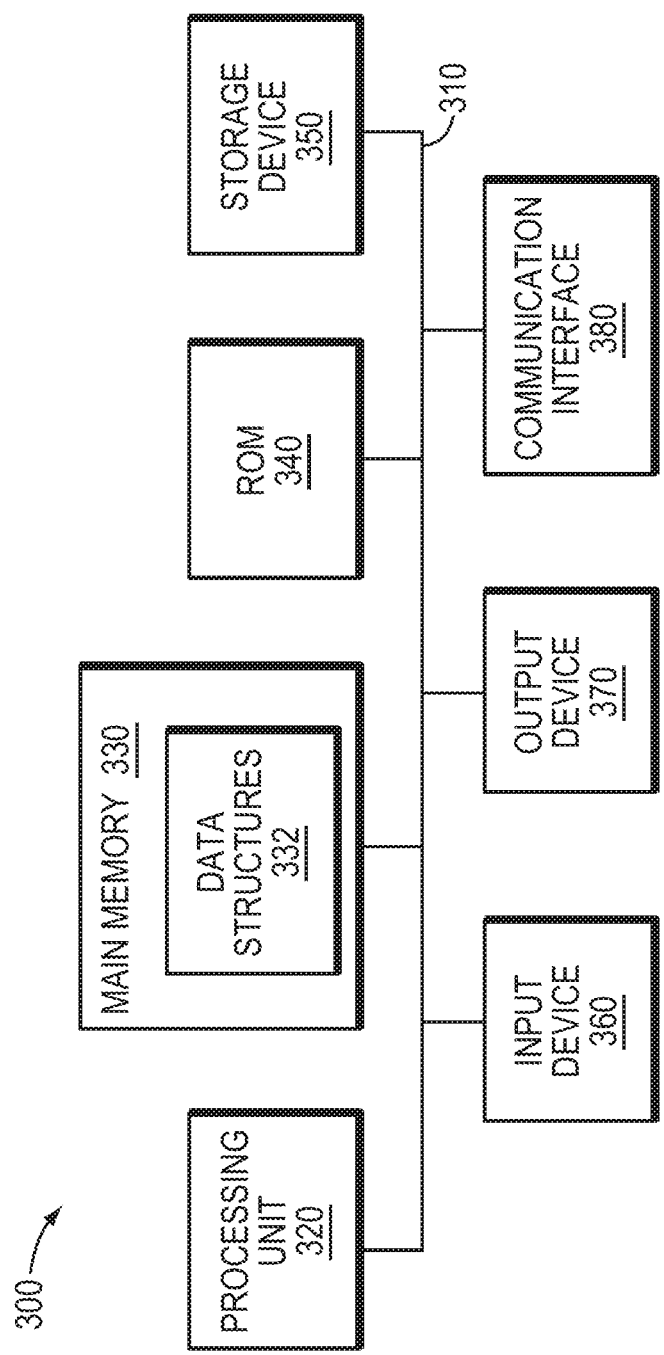
FIG. 3 is an example diagram of a device that may correspond to one or more of the devices of the example environment.

FIG. 3 is an example diagram of a device, such as data processing system 300, which may correspond to one or more of the devices of environment 200. As illustrated, system 300 may include a bus 310, a processing unit 320, a main memory 330, a read-only memory (ROM) 340, a storage device 350, an input device 360, an output device 370, and/or a communication interface 380. Bus 310 may include a path that permits communication among the components of system 300.

Processing unit 320 may include one or more processors, microprocessors, or other types of processing units that may interpret and execute instructions. Main memory 330 may include one or more random access memories (RAMs) or other types of dynamic storage devices having a plurality of memory locations addressable by the processing unit 320 to store information, including instructions, and data structures 332 for execution and manipulation by processing unit 320. ROM 340 may include one or more ROM devices or other types of static storage devices that may store static information and/or instructions for use by processing unit 320. Storage device 350 may include a magnetic and/or optical recording medium and its corresponding drive.

Input device 360 may include a mechanism that permits a user to input information to system 300, such as a keyboard, a camera, an accelerometer, a gyroscope, a mouse, a pen, a microphone, voice recognition and/or biometric mechanisms, a remote control, a touch screen, a neural interface, etc. Output device 370 may include a mechanism that outputs information to the user, including a display, a printer, a speaker, etc. Communication interface 380 may include any transceiver-like mechanism that enables system 300 to communicate with other devices, networks, and/or systems. For example, communication interface 380 may include mechanisms for communicating with another device or system via a network.

As described herein, data processing system 300 may perform certain operations in response to processing unit 320 executing software instructions contained in a computer-readable medium, such as main memory 330. A computer-readable medium may be defined as a non-transitory memory device. A memory device may include space within a single physical memory device or spread across multiple physical memory devices. The software instructions may be read into main memory 330 from another computer-readable medium, such as storage device 350, or from another device via communication interface 380. The software instructions contained in main memory 330 may cause processing unit 320 to perform processes described herein. Alternatively, hardwired circuitry may be used in place of or in combination with software instructions to implement processes described herein. Thus, implementations described herein are not limited to any specific combination of hardware circuitry and software.

Although FIG. 3 shows example components of data processing system 300, in other implementations, system 300 may include fewer components, different components, differently arranged components, and/or additional components than depicted in FIG. 3. Alternatively, or additionally, one or more components of system 300 may perform one or more other tasks described as being performed by one or more other components of system 300.

Figure 4:
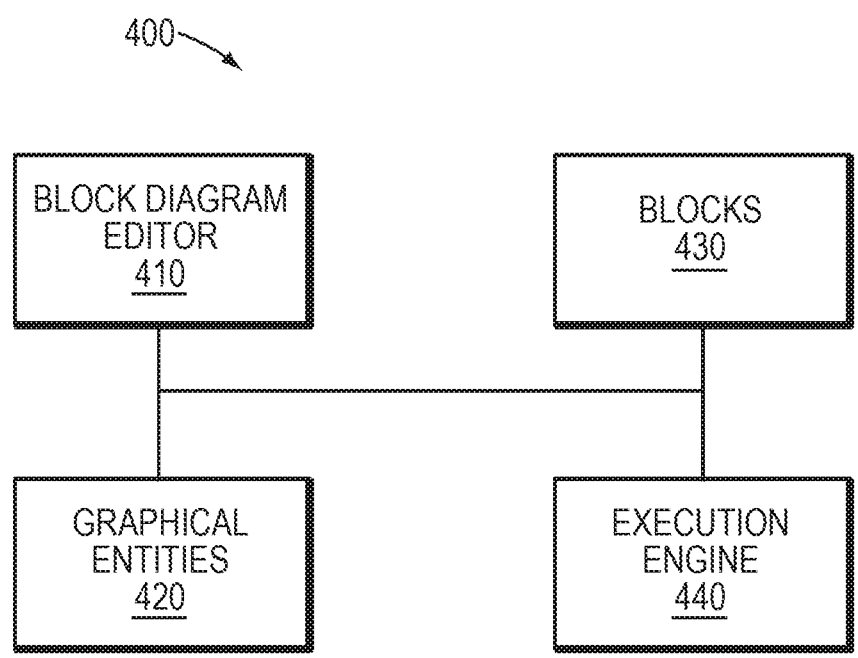
FIG. 4 is a diagram of example functional components of a technical computing environment (TCE) that may be used by one or more of the devices of the example environment.

FIG. 4 is a diagram of example functional components of TCE 400. In some implementations, the functions described in connection with FIG. 4 may be performed by one or more components of system 300 (FIG. 3) and/or by one or more systems 300. As shown in FIG. 4, TCE 400 may include a block diagram editor 410, graphical entities 420, blocks 430, and/or an execution engine 440.

Block diagram editor 410 may include hardware or a combination of hardware and software that may be used to graphically specify models of dynamic systems. In some implementations, block diagram editor 410 may permit a user to perform actions, such as construct, edit, display, annotate, save, and/or print a graphical model (e.g., a block diagram that visually and/or pictorially represents a dynamic system). In another implementation, block diagram editor 410 may permit a user to create and/or store data relating to graphical entities 420.

A textual interface may be provided to permit interaction with block diagram editor 410. For example, a user may write free-form text, such as scripts, that perform automatic editing operations on a model using the textual interface. For example, the textual interface may provide a set of windows that may act as a canvas for the model, and may permit user interaction with the model. A model may include one or more windows depending on whether the model is partitioned into multiple hierarchical levels.

Graphical entities 420 may include hardware or a combination of hardware and software that may provide entities (e.g., signal lines, buses, physical connections, etc.) that represent how data may be communicated between functional and/or non-functional units and blocks 430 of a model. Blocks 430 may include fundamental mathematical elements of a block diagram model. For example, blocks 430 may include graphical representations, such as squares, rectangles, circles, etc., for representing mathematical elements included in a model. The graphical representations may include program code and have executable semantics that cause functionality of the mathematical elements to be implemented when the model is executed, e.g., simulated behavior of the components is exhibited. The components may include sources or sinks, in which case they might only have an output or input, respectively. Components with physical ports only may represent network components that define physical constraints at their ports (e.g., voltages, pressures and temperatures).

Execution engine 440 may include hardware or a combination of hardware and software that may process a graphical model to produce simulation results, may convert the graphical model into executable code, and/or may perform other analyses and/or related tasks on behalf of one or more models. In some implementations, for a block diagram graphical model, execution engine 440 may translate the block diagram into executable entities (e.g., units of execution) following the layout of the block diagram. The executable entities may be converted into intermediate representations, compiled and/or executed on a device (e.g., client device 210) to implement the functionality specified by the model.

Graphical models may include model components having relationships with other model components, and the relationships and/or the model components may have attributes associated with them. The relationships may include model elements such as connector lines and references. The attributes may include value information and meta-information for the model component associated with the attributes. Graphical models may be associated with configuration information. The configuration information may include information for the graphical model such as model execution information (e.g., numerical integration schemes, fundamental execution period, etc.), model diagnostic information (e.g., whether an algebraic loop should be considered an error or result in a warning), model optimization information (e.g., whether model elements should share memory during execution), model processing information (e.g., whether common functionality should be shared in code that is generated for a model), etc.

Additionally, or alternatively, a graphical model may have executable semantics and/or may be executable. An executable graphical model may be a time based block diagram. A time based block diagram may consist, for example, of blocks (e.g., blocks 430) connected by lines (e.g., connector lines). The blocks may consist of elemental dynamic systems such as a differential equation system (e.g., to specify continuous-time behavior), a difference equation system (e.g., to specify discrete-time behavior), an algebraic equation system (e.g., to specify constraints), a state transition system (e.g., to specify finite state machine behavior), an event based system (e.g., to specify discrete event behavior), etc. The lines may represent signals (e.g., to specify input/output relations between blocks or to specify execution dependencies between blocks), variables (e.g., to specify information shared between blocks), physical connections (e.g., to specify electrical wires, pipes with volume flow, rigid mechanical connections, etc.), etc. The attributes may consist of meta-information such as sample times, dimensions, complexity (whether there is an imaginary component to a value), data type, etc. associated with the model elements.

In a time based block diagram, ports may be associated with blocks (e.g., blocks 430). A relationship between two ports may be created by connecting a line (e.g., a signal line) between the two ports. Signals correspond to the time-varying quantities represented by each signal line connection and are assumed to have values at each time instant. The source block of a signal writes to the signal at a given time instant when its system equations are solved. The destination blocks of this signal read from the signal when their system equations are being solved. Lines may also, or alternatively, be connected to other lines, for example by creating branch points. For example, three or more ports can be connected by connecting a line to each of the ports, and by connecting each of the lines to a common branch point for all of the lines. A common branch point for the lines that represent physical connections may be a dynamic system (e.g., by summing all variables of a certain type to zero or by equating all variables of a certain type). A port may be an input port, an output port, an enable port, a trigger port, a function-call port, a publish port, a subscribe port, an exception port, an error port, a physics port, an entity flow port, a data flow port, a control flow port, etc.

Relationships between blocks (e.g., blocks 430) may be causal and/or non-causal (acausal). For example, a model may include a block that represents a continuous-time integration block that may be causally related to a data logging block by using a line (e.g., a connector line) to connect an output port of the continuous-time integration block to an input port of the data logging block. Further, during execution of the model, the value stored by the continuous-time integrator may change as the current time of the execution progresses. The value of the state of the continuous-time integrator may be available on the output port, and the connection with the input port of the data logging block may make this value available to the data logging block.

A sample time may be associated with the elements of a graphical model. For example, a graphical model may include a block (e.g., block 430) with a continuous sample time, such as a continuous-time integration block that may integrate an input value as a time of execution progresses. This integration may be specified by a differential equation. During execution, the continuous-time behavior may be approximated by a numerical integration scheme that is part of a numerical solver. The numerical solver may take discrete steps to advance the execution time, and these discrete steps may be constant during an execution (e.g., fixed step integration) or may be variable during an execution (e.g., variable-step integration).

Acausal blocks may be continuous time and defined by differential equations, e.g., current through a capacitor is equal to a constant times the rate of change of voltage across it. As for causal systems, numerical integration may be used to approximate behavior, but with the added complexity of constraints between variables (e.g., all component nodes connected to each other are at the same potential), including differential constraints (e.g., two capacitors connected in parallel define two differential variables which essentially define the same voltage variable). Solving these types of equations may involve additional steps to manage constraints and specialist solvers (e.g., implicit solvers) can be used for better simulation performance. Many systems include both physical parts (e.g., motors, pumps, gears, etc.) and algorithmic parts (e.g., digital controllers, fault detection code, etc.), and may be modeled with a mixture of causal and acausal blocks. One possible implementation manages the causal and acausal parts separately; this suits applications where the causal part is all discrete time, e.g., all algorithmic. In another implementation, a single execution engine handles both causal and acausal parts.

Alternatively, or additionally, a graphical model may include a block (e.g., block 430) with a discrete sample time such as a unit delay block that may output values of a corresponding input after a specific delay. This delay may be a time interval, and this interval may determine a sample time of the block. During execution, the unit delay block may be evaluated each time the execution time has reached a point in time where an output of the unit delay block may change. These points in time may be statically determined based on a scheduling analysis of the graphical model before starting execution.

Alternatively, or additionally, a graphical model may include a block (e.g., block 430) with an asynchronous sample time, such as a function-call generator block that may schedule a connected block to be evaluated at a non-periodic time. During execution, a function-call generator block may evaluate an input, and, when the input attains a specific value when the execution time has reached a point in time, the function-call generator block may schedule a connected block to be evaluated at this point in time and before advancing execution time.

Further, the values of attributes of a graphical model may be inferred from other elements of the graphical model or attributes of the graphical model. For example, the graphical model may include a block (e.g., block 430), such as a unit delay block, that may have an attribute that specifies a sample time of the block. When a graphical model has an execution attribute that specifies a fundamental execution period, the sample time of the unit delay block may be inferred from this fundamental execution period.

As another example, the graphical model may include two unit delay blocks (e.g., blocks 430) where an output of the first of the two unit delay blocks is connected to an input of the second of the two unit delay block. The sample time of the first unit delay block may be inferred from the sample time of the second unit delay block. This inference may be performed by propagation of model element attributes such that, after evaluating a sample time attribute of the second unit delay block, a graph search proceeds by evaluating a sample time attribute of the first unit delay block since the first unit delay block is directly connected to the second unit delay block.

The values of attributes of a graphical model may be set to characteristics settings, such as one or more inherited settings, one or more default settings, etc. For example, the data type of a variable that is associated with a block (e.g., block 430) may be set to a default, such as a double. Because of the default setting, an alternate data type (e.g., a single, an integer, a fixed point, etc.) may be inferred based on attributes of elements that the graphical model includes (e.g., the data type of a variable associated with a connected block) and/or attributes of the graphical model. As another example, the sample time of a block may be set to be inherited. In the case of an inherited sample time, a specific sample time may be inferred based on attributes of elements that the graphical model includes and/or attributes of the graphical model (e.g., a fundamental execution period).

Although FIG. 4 shows example functional components of TCE 400, in other implementations, TCE 400 may include fewer functional components, different functional components, differently arranged functional components, and/or additional functional components than depicted in FIG. 4. Alternatively, or additionally, one or more functional components of TCE 400 may perform one or more other tasks described as being performed by one or more other functional components of TCE 400.

Parameter Estimation

Figure 5A:
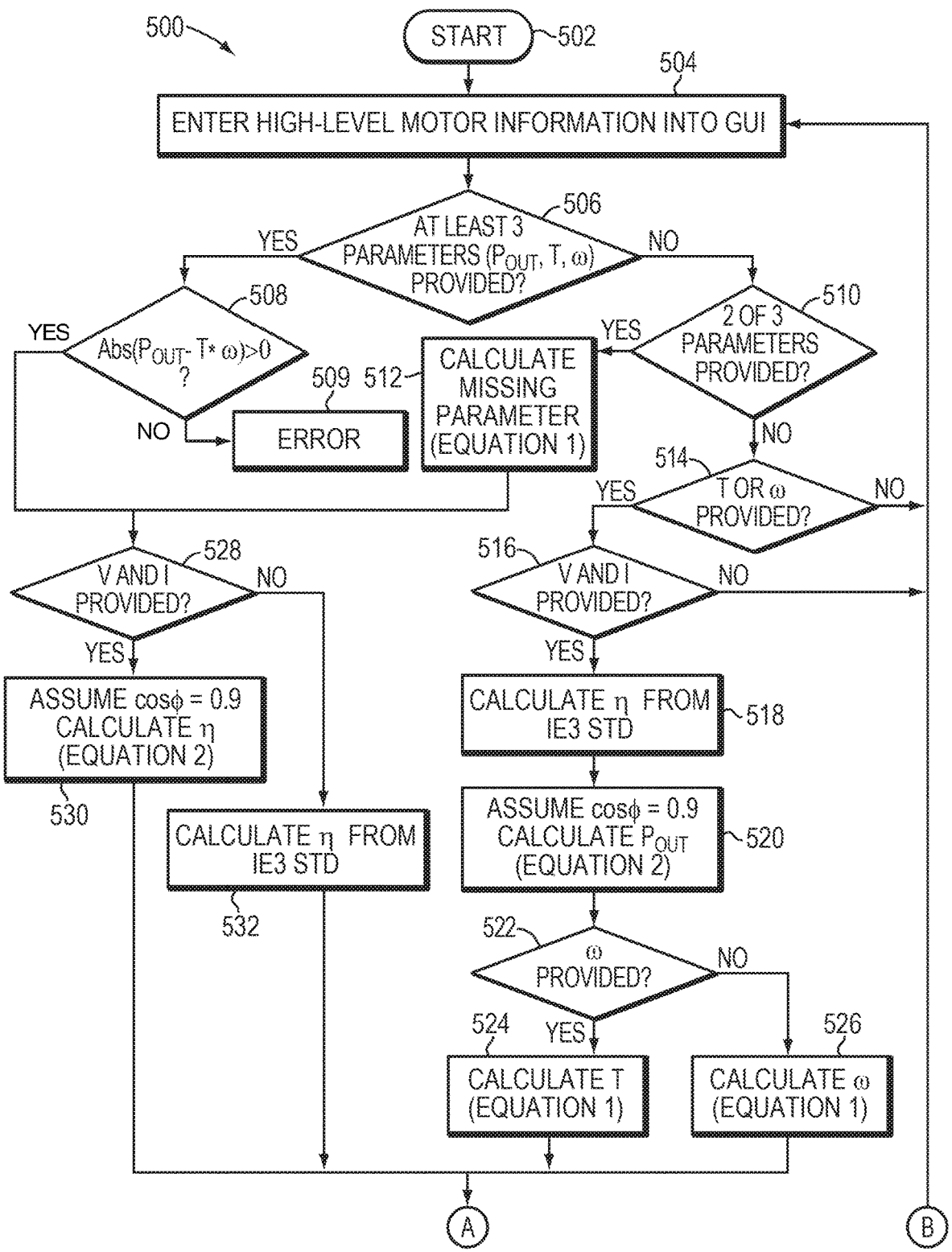
FIGS. 5A-5C are flowcharts of an example procedure for estimating unknown parametric values used by a lumped parameter model of a motor.
Figure 5B:
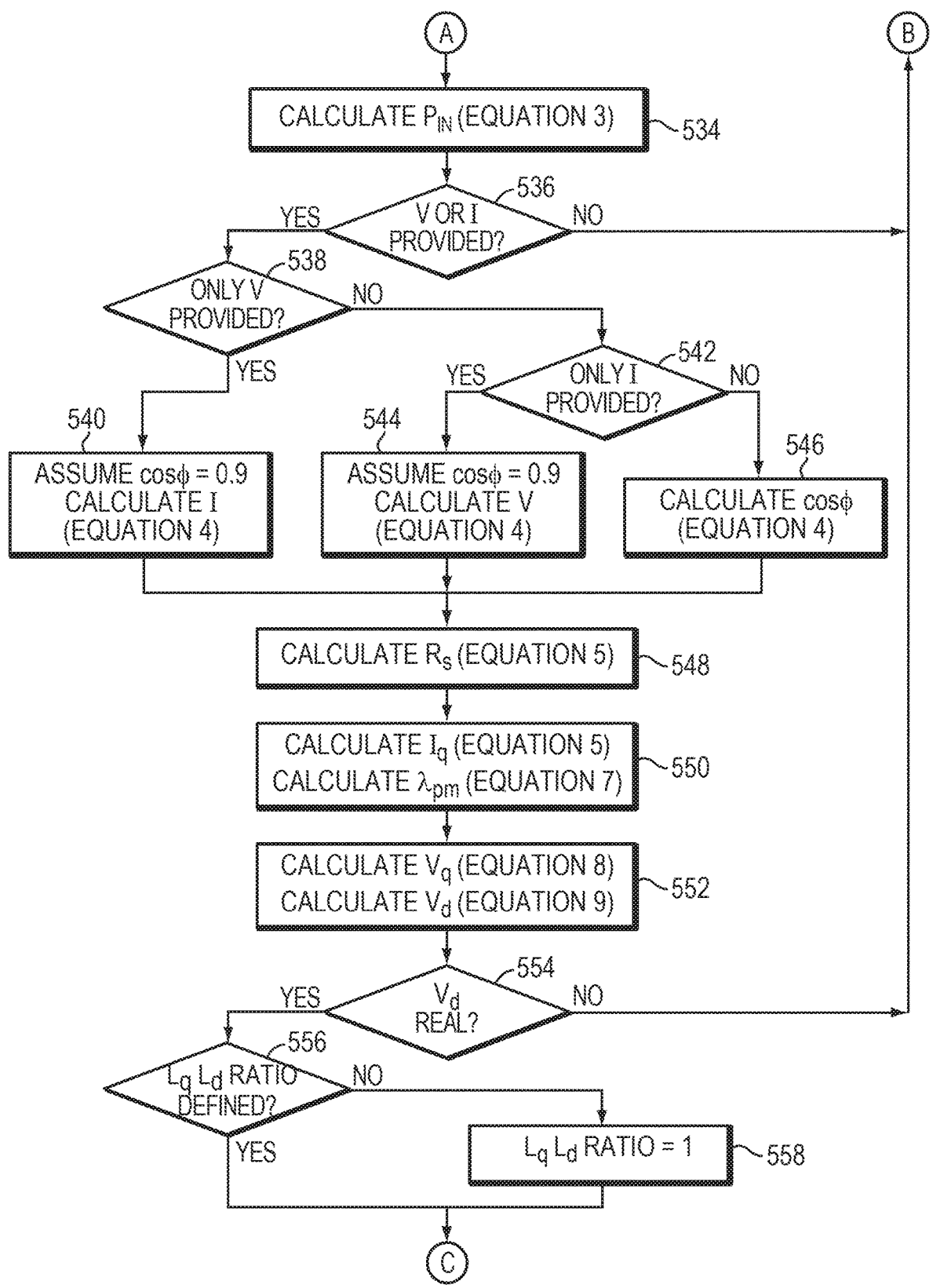
Figure 5C:
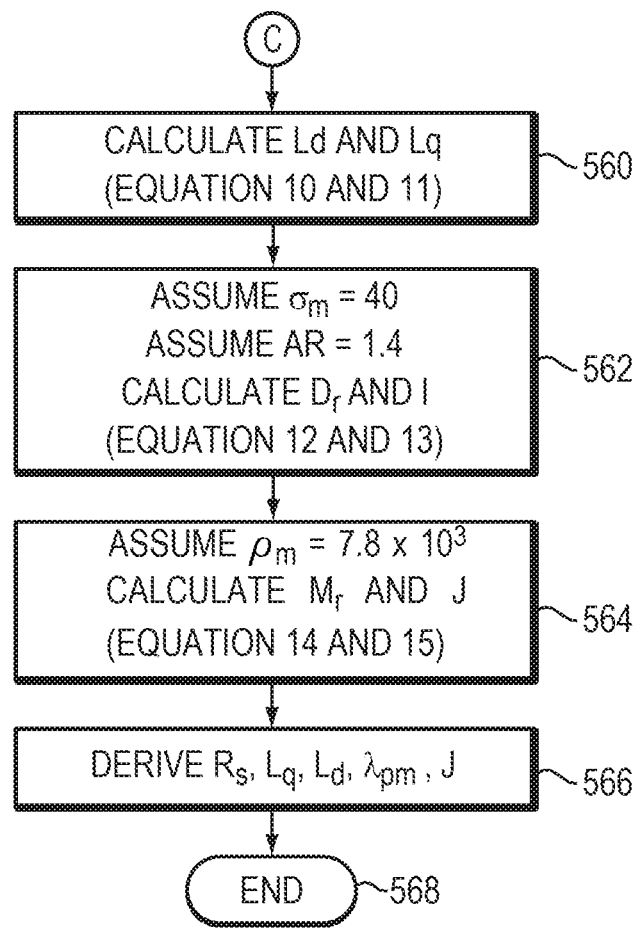

FIGS. 5A-5C are flowcharts of an example procedure 500 for estimating unknown parametric values used to generate a lumped parameter model of a motor according to techniques described herein. Illustratively, the procedure 500 starts at box 502 and proceeds to box 504 where known, e.g., predetermined, parametric values obtained from the initial high-level motor information is entered, e.g., into a dialog box of GUI 105 of input device 360 of data processing system 300. The predetermined parametric values obtained from initial high-level motor information may include one or more of output power ($P_{out}$), output torque (T) angular velocity ($\omega$), voltage (V), current (I), and efficiency ($\eta$). In some embodiments, values for at least three of these initial high-level parameters may be known or predetermined from, e.g., the motor nameplate 135, datasheets, and/or design requirements as initial conditions.

An aspect of the techniques may involve assumptions used to establish one or more of the predetermined parametric values initially applied to a sequence of algorithmic calculations of equations defining the motor to derive estimates of the unknown or missing parameters (parametric values) for the motor model. For example, it may be assumed that the motor (PMSM) may move a certain load, thus requiring torque T, and may spin at a certain angular velocity $\omega$ to move the load within a certain time frame. These initial mechanical design requirements or constraints of the motor may form a first set of initial motor information that is known or predetermined, and provided as input to appropriate equations of the procedure 500. A second set of initial motor information may relate to electrical constraints based on a power amplification system used to drive the motor. For example, it may be assumed that a power amplifier may deliver a bus voltage V and current I to the motor. A third set of initial motor information may include any of the remaining high-level parameters except efficiency. In some embodiments, National Electrical Manufacturers Association (NEMA) data pertaining to the selected class of motor (e.g., PMSM) may be used to estimate an expected efficiency value. The third set of motor information may be obtained from NEMA data used to derive a value of expected efficiency $\eta$ for input into the appropriate equations of the procedure 500. As a result, initial design constraints of the first and second sets of motor information may lead to an estimate of the third set of motor information.

At decision box 506, a determination may be rendered as to whether at least three parameters, e.g., $P_{out}$, T, and $\omega$, are provided. If so, the parameters may be verified as to whether Power ($P_{out}$) equals torque (T) times speed ($\omega$), for example by testing whether the absolute difference of the quantity $P_{out}-T*\omega$ is equal to zero for example with a numerical tolerance, e.g., Abs($P_{out}-T*\omega$)>0, as indicated at box 508. If so, then the procedure may proceed to decision box 528. If not, an error may be generated, as indicated at box 509. If at least three parameters are not provided, the procedure may proceed to decision box 510 where it is determined whether two of the three parameters, e.g., ($P_{out}$ and T) or ($P_{out}$ and $\omega$) or (T and $\omega$), are provided. If so, the missing third parameter (e.g., T, $\omega$, or $P_{out}$) may be calculated at box 512 in accordance with the following equation 1:

$$T=P_{out}/\omega \quad \text{(equation 1)}$$

The procedure 500 may then proceed to decision box 528. If, however, at least two of the three parameters are not provided (at decision box 510), then at decision box 514 it may be determined whether T or $\omega$ is provided. If not, the procedure may return back to box 504. Yet, if T or $\omega$ is provided, then at decision box 516 it may be determined whether parameters V and I are provided. If not, the procedure may return to box 504; otherwise, efficiency $\eta$ may be calculated, for example from NEMA data of the IE3 Standard using interpolation (box 518). That is, a value of efficiency $\eta$ may be obtained, for example from IE3 Standard by iterating over the NEMA data tables using to linear interpolation. The procedure 500 may then proceed to box 520 where a high power factor cos $\phi$=0.9 may be assumed based on, e.g., empirical data from industry experience of power factors for the particular class of motors (PMSM).

Given the assumption of power factor cos ϕ=0.9, the output power $P_{out}$ may be obtained in accordance with the following equation 2:

$$P_{out}=3*V*I*\cos \phi * \eta \qquad \text{(equation 2)}$$

The procedure 500 may then proceed to decision box 522 where it may be determined whether ω is provided. If so, then T may be calculated at box 524 using equation 1 above; otherwise, ω may be calculated at box 526 in accordance with a variation of equation 1:

$$\omega=P_{out}/T \qquad \text{(equation 1)}$$

The procedure may then proceed to box 534. At decision box 528, a determination may be rendered as to whether parameters V and I are provided. If so, at box 530 a high power factor cos ϕ=0.9 may be assumed based on, as previously noted, empirical data from industry experience of power factors for PMSM class motors. Given the assumption of power factor cos ϕ=0.9, the efficiency η may be obtained in accordance with a variation of equation 2:

$$\eta=P_{out}/3*V*I*\cos \phi \qquad \text{(equation 2)}$$

If parameters V and I are not provided (decision box 528), then η may be calculated, for example from NEMA data of the IE3 Standard using interpolation at box 532. The procedure 500 may then proceed to box 534 where $P_{in}$ may be calculated in accordance with the following equation 3:

$$P_{in}=P_{out}/\eta \qquad \text{(equation 3)}$$

At decision box 536, a determination may be rendered as to whether V or I is provided. If neither parameter is provided, the procedure returns to box 504. If V or I is provided, a determination may be rendered at decision box 538 as to whether only V is provided. If only V is provided, then current I may be calculated at box 540. Illustratively and assuming the empirically-obtained power factor cos ϕ=0.9, parameter I may be calculated in accordance with the following equation 4:

$$I=P_{in}/3*V*\cos \phi \qquad \text{(equation 4)}$$

The procedure 500 then proceeds to box 548. If the determination from decision box 538 is No, then a determination may be rendered at decision box 542 as to whether only I is provided. If so, then voltage V may be calculated at box 544 (again assuming the power factor cos ϕ=0.9) in accordance with a variation of equation 4:

$$V=P_{in}/3*I*\cos \phi \qquad \text{(equation 4)}$$

The procedure 500 may then proceed to box 548. If the determination from decision box 542 is No, then at box 546 a refined value of the power factor parameter cos ϕ may be calculated in accordance with a variation of equation 4:

$$\cos \phi=P_{in}/3*V*I \qquad \text{(equation 4)}$$

At box 548, a value of another unknown parameter, e.g., the stator resistance $R_s$, may be calculated. The total power loss equals the input power minus the output power. A reasonable, empirically-obtained percentage of the total losses is assumed to be stator loss (e.g., due to copper loss of coils in the motor), e.g., 50%, then $R_s$ may be calculated in accordance with the following equation 5:

$$R_s=\frac{0.5(P_{in}-P_{out})}{3I^2} \qquad \text{(equation 5)}$$

At box 550, values of other unknown parameters, e.g., the q-axis current $I_q$ and the permanent magnetic flux $\lambda_{pm}$, may be calculated according to the following equations 6 and 7, where p is a number of pole pairs:

$$I_q=\text{sqrt}(2)*I \qquad \text{(equation 6)}$$

$$\lambda_{pm}=T/(1.5*p*I_q) \qquad \text{(equation 7)}$$

At box 552, additional values of unknown parameters, e.g., the q-axis voltage $V_q$ and d-axis voltage $V_d$, may be calculated according to the following equations 8 and 9, where p is the number of pole pairs:

$$V_q=R_s*I_q+p*\omega*\lambda_{pm} \qquad \text{(equation 8)}$$

$$V_d=\text{sqrt}((\text{sqrt}(2)*V)^2-V_q^2) \qquad \text{(equation 9)}$$

At decision box 554, a determination may be rendered as to whether is $V_d$ real. If not, the procedure 500 may return to box 504. Yet if $V_d$ is real, then at decision box 556 a determination may be rendered as to whether q-axis inductance ($L_q$) over the d-axis inductance ($L_d$) ratio, e.g., $L_qL_d$Ratio, is defined. If not, then $L_qL_d$Ratio may be assumed to be 1 at box 558. If the $L_qL_d$Ratio is defined, then at box 560 the d-axis inductance $L_d$ may be calculated in accordance with the following equations 10 and 11:

$$L_q=-V_d/(p*\omega*I_q) \qquad \text{(equation 10)}$$

$$L_d=L_q/L_qL_d\text{Ratio} \qquad \text{(equation 11)}$$

At box 562 values of additional unknown parameters, e.g., the diameter of the rotor $D_r$ and the length of the rotor 1, may be calculated. Assume that $\sigma_m$ is the magnetic shear stress (with unit of kN/m²) on the surface of the rotor, and that a value of the shear stress for PMSM may be estimated to fall in a range of, e.g., 40-60 kN/m². For machines with low rating, that value may be lower (e.g., due to the difficulty of manufacturing). In addition, an aspect ratio (AR) may be estimated to fall in a range of, e.g., 1 to 2. In some embodiments, the values of $\sigma_m$ and AR may be assumed to be 40 and 1.4, respectively. The unknown parameters $D_r$ and 1 may thus be estimated using two equations 12 and 13:

$$T=\frac{\pi}{2}\eta\cos\phi\sigma_m D_r^2 1 \qquad \text{(equation 12)}$$

$$AR=\frac{p1}{\pi D_r} \qquad \text{(equation 13)}$$

At box 564, the mass density of the rotor $\rho_m$ may be assumed to be $7.8\times10^3$ kg·m³ and the values of other unknown parameters, e.g., mass of the rotor $m_r$ and rotor inertia J, may be estimated using equations 14 and 15:

$$m_r=\rho_m\pi\left(\frac{D_r}{2}\right)^2 1 \qquad \text{(equation 14)}$$

$$J=\frac{1}{2}m_r\left(\frac{D_r}{2}\right)^2 \qquad \text{(equation 15)}$$

In some examples, the estimated parametric values derived from the algorithmic calculations, e.g., of the example procedure 500 (box 566), include the stator resistance $R_s$, the q-axis inductance $L_q$, the d-axis inductance $L_d$, the permanent magnetic flux $\lambda_{pm}$, and the rotor inertia J. The procedure then ends at box 568. The estimated parametric values can be used by a lumped parameter model for the PMSM motor.

Figure 6:
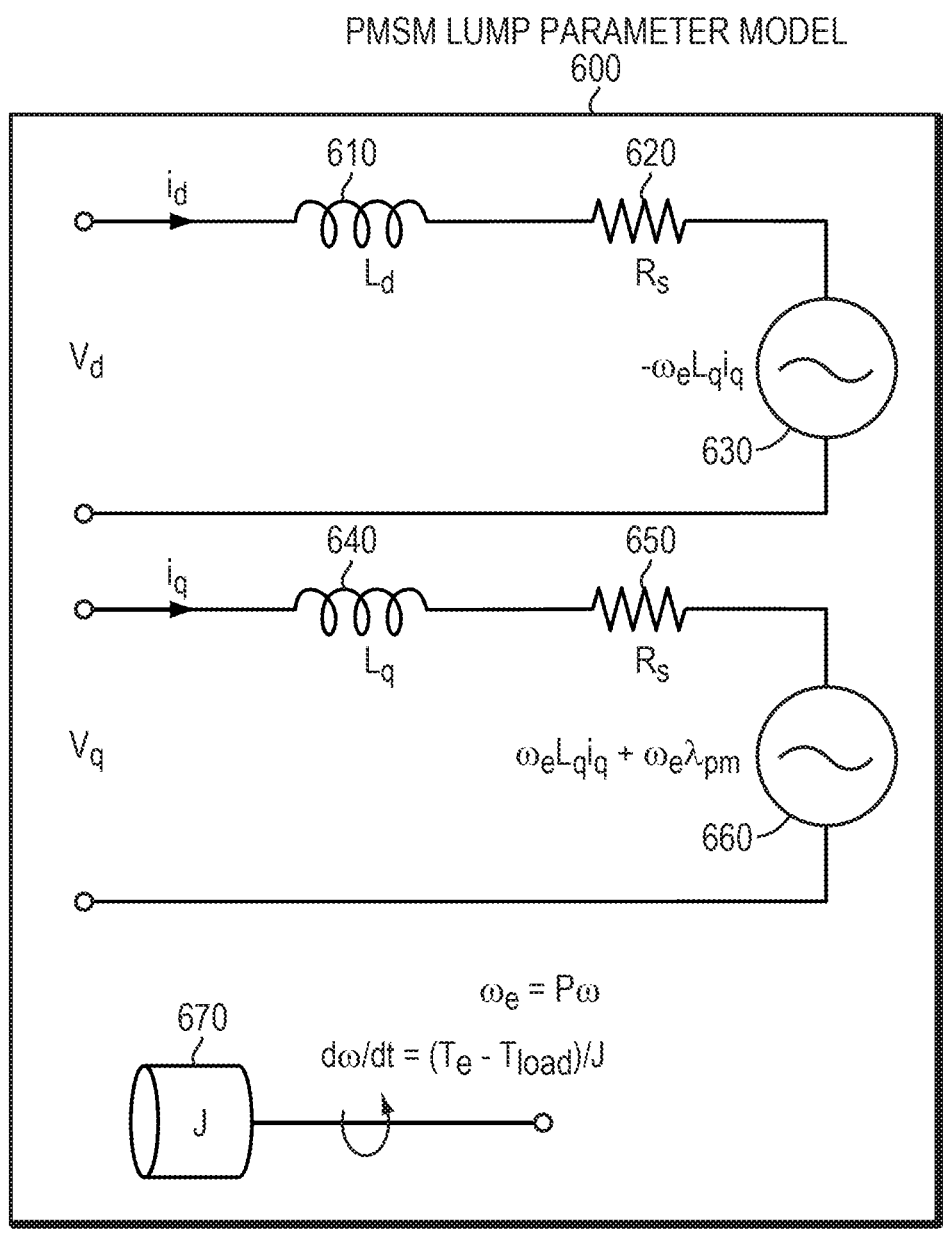
FIG. 6 is an example of a lumped parameter model of a motor.

FIG. 6 is an example circuit diagram of a lumped parameter motor model. The lumped parameter model 600 may include electrical components 610-630 and 640-660, which may represent parts of the PMSM, such as the coils of the stator as well as a permanent magnet attached to the rotor, and mechanical component 670. The electrical components 610-630 and 640-660 may have representations of electrical circuits used to model the voltage and current in coils of the stator in the motor. The electrical circuit representations may model voltages and currents using a d-q rotor reference frame model to represent voltages $V_d$, $V_q$ and currents $I_d$ and $I_q$. The voltages $V_d$ and $V_q$, and currents $I_d$ and $I_q$ of the d-q rotor frame reference may be converted to voltages and currents of individual coils of the motor using, e.g., a Parks transformation for example as described in connection with the abc to dq0 block of the Simulink model-based design system. The mechanical component 670 may model the angular acceleration and angular velocity of the motor.

The estimated parametric values of the lumped parameter model for the PMSM motor may be used to enable development and simulation of a system including, e.g., a dynamic controller model and a plant model, in the modeling environment of the TCE 400 executing on the data processing system 300.

Figure 7:
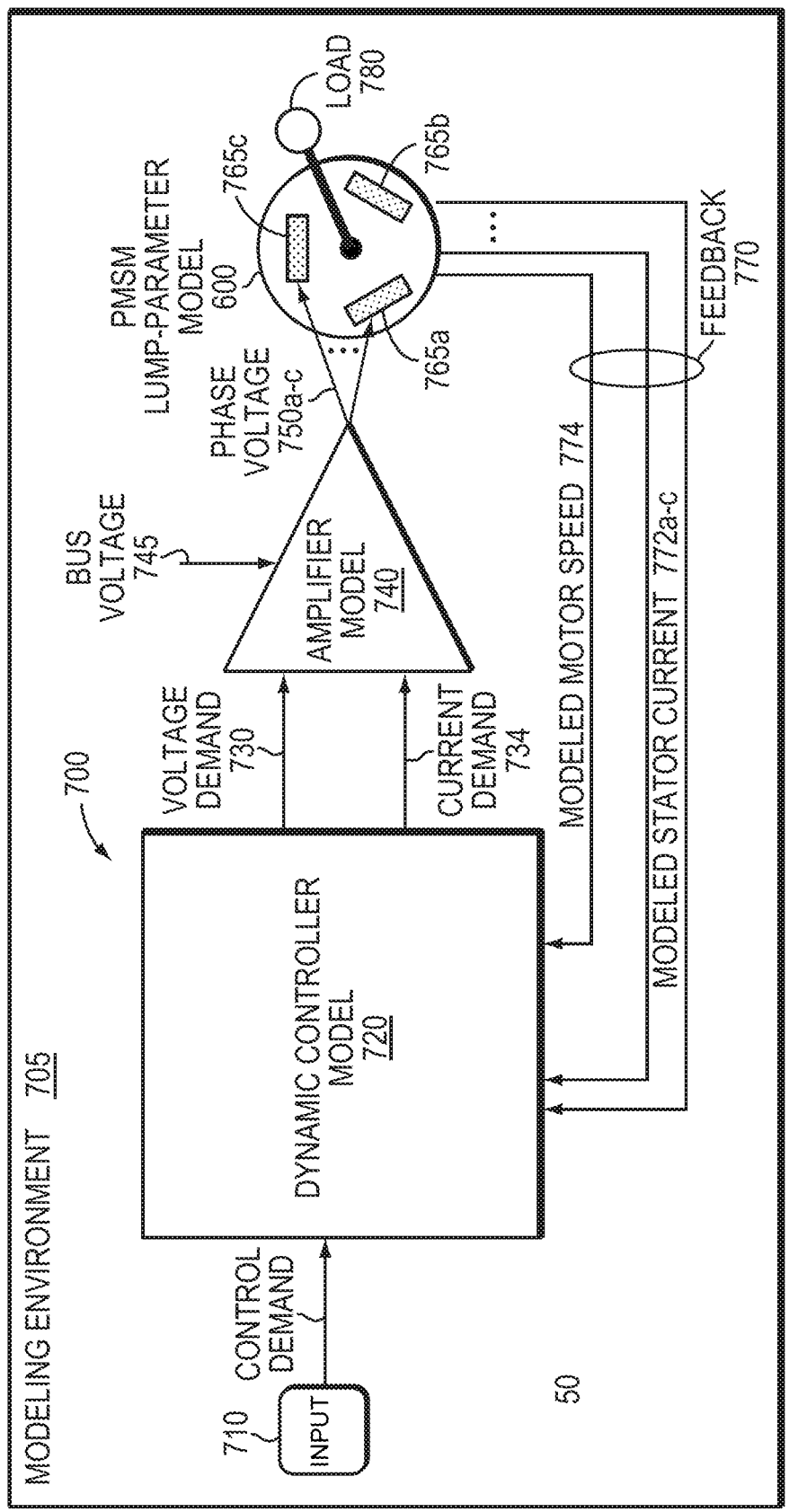
FIG. 7 is a diagram of an example modeling environment executing on the TCE that simulates a closed loop system using a dynamic controller to control a lumped parameter model of a motor.

FIG. 7 is a diagram of an example modeling environment 705 executing on the TCE 400 that simulates a closed loop system using a dynamic (e.g., feedback-based) controller to actuate a lumped parameter model of a motor. Illustratively, a system model 700 may include a dynamic controller model 720, an amplifier model 740, a PMSM lumped parameter model 600, and a load 780 configured and arranged as a closed loop system. In some embodiments, the motor model is implemented as the PMSM lumped parameter model previously described. The dynamic controller model 720 has an input 710 as a control demand and outputs a voltage demand 730 and/or a current demand 734 to the amplifier model 740. Illustratively, the amplifier model 740 may provide phase voltages 750a-c to coils (e.g., stator coils) 765a-c of the motor model 600. Specifically, the motor model 600 may provide modeled stator coil currents 772a-c and a modeled motor speed 774 as the feedback 870 to the dynamic controller model 720. Simulation of the system model 700 may support refinement, testing, and validation of the dynamic controller model 720 within the closed loop system.

The dynamic controller model 720 may describe, for example, elements of a control system, an interaction between elements of a control system, and/or one or more transfer functions that describe how outputs of the dynamic controller model 720 are generated from inputs to the dynamic controller model 720.

Having estimations of the key parameters of a PMSM lumped parameter model can allow use of approximate representation, e.g., the motor model, of an actual PMSM motor in closed-loop control systems, e.g., in simulation of the control systems, for control of the actual plant including PMSM scheduling involving feed-forward/feed-back, or for improving existing control laws or designing new, better control laws of the actual closed-loop system, taking the advantages of the estimated parametric values. An example of existing control laws includes feed-forward/feed-back gain control/scheduling. In another example, the techniques can be used in efficient adaptive inverse control laws. For example, approximated inverse of the plant model that includes the PMSM lumped parameter model can be estimated, with the estimated parametric values, and the estimated inverse plant model can be used in realization of adaptive inverse control laws, e.g., through automatic code generation.

Code can be automatically generated, for example, for one or more parts of the algorithms, e.g., those shown in FIGS. 5A-5C, based on the known parameters known to the controller, and can be included into part of the implementation of the controller code. As an example, in FIG. 5A, when only two of the three parameters in box 504 are provided, equation 1 can be automatically generated for the controller code to estimate the third parameter. Furthermore, equations 2-5, 7-10, and 12-15 can be automatically generated, e.g., for the controller code, to calculate the respective parametric values specified by the equations. With these estimated parametric values, a lumped parameter model may be effectively generated and may be available for use by the inverse control laws, and inverse of the plant model can be estimated.

The automatically generated code may be textual code, such as textual source code, that may be compiled, for example by a compiler, and executed on a target machine or device, which may not include a modeling environment, simulation engine, and/or TCE. The generated code may conform to one or more programming languages, such as Ada, Basic, C, C++, C#, SystemC, FORTRAN, VHSIC Hardware Description Language (VHDL), Verilog, a vendor or target specific hardware description language (HDL) code, such as Xilinx Field Programmable Gate Array (FPGA) libraries, assembly code, etc. In some implementations, the generated code may include header, main, make, and other source files. A compiler may compile the generated code for execution by target hardware, such as an embedded system, which may include a Central Processing Unit (CPU), a microprocessor, a Digital Signal Processor (DSP), a Field Programmable Gate Array (FPGA), a System on a Chip (SoC), an Application Specific Integrated Circuit (ASIC), etc. In some embodiments, the generated code may be accessed by a hardware synthesis tool chain, which may configure a programmable hardware device, such as the FPGA, from the generated code. The automatically generated code may be stored in memory, e.g., persistent memory, such as a hard drive or flash memory, of a data processing device.

In some implementations, the non-iterative estimations of the parametric values can improve the efficiencies of simulations, estimations of the inverse plant model, the incorporation of the inverse plant model into related control laws, or use of control laws.

Illustratively, the main memory 330 of the data processing system 300 may be organized with data structures 332 representing the plant model 700, including the dynamic controller model 720 and the PMSM lumped parameter model 600, that enhance simulation of the system through an improvement in parametric data of the motor model 600. That is, the one or more algorithms (procedure 500) derive the unknown parametric values for the motor model 600 so as to enable simulation of the system.

The foregoing description of embodiments is intended to provide illustration and description, but is not intended to be exhaustive or to limit the embodiments to the precise form disclosed. Modifications and variations are possible in light of the above teachings or may be acquired from a practice of the embodiments. For example, while a series of acts has been described above with respect to the flow diagrams, the order of the acts may be modified in other implementations. Further, non-dependent acts may be performed in parallel. Also, the term "user", as used herein, is intended to be broadly interpreted to include, for example, a computer or data processing system (e.g., system 300) or a user of a computer or data processing system, unless otherwise stated.

Further, certain embodiments may be implemented as logic that performs one or more functions. This logic may be hardware-based, software-based, or a combination of hardware-based and software-based. Some or all of the logic may be stored in one or more tangible non-transitory computer-readable storage media and may include computer-executable instructions that may be executed by a computer or data processing system, such as system 300. The computer-executable instructions may include instructions that implement one or more embodiments described herein. The tangible non-transitory computer-readable storage media may be volatile or non-volatile and may include, for example, flash memories, dynamic memories, removable disks, and non-removable disks.

No element, act, or instruction used herein should be construed as critical or essential to the embodiments unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

The foregoing description has been directed to specific embodiments. It will be apparent, however, that other variations and modifications may be made to the described embodiments, with the attainment of some or all of their advantages. For example, in addition to or instead of executable graphical models, the embodiments may be used with graphical models having executable semantics, such as models created using Architecture Analysis and Design Language (AADL), Uniform Modeling Language (UML), and/or SysML tools. In addition, the generated code may include fixed-point code to run on a fixed-point processor, or code to emulate fixed-point behavior on a floating-point processor. Therefore, it is the object of the appended claims to cover all such variations and modifications as come within the true spirit and scope of the embodiments.

What is claimed is:

1. A method comprising:
   deriving, by a data processing system, an estimate for at least one unknown parametric value for a permanent magnet synchronous (PMSM) motor based on at least two known quantities or parametric values of the PMSM motor, wherein the at least one unknown parametric value and the at least two known quantities or parametric values belong to categories and a first category to which the at least one unknown parametric value belongs is different than a second category to which the at least two known quantities or parametric values belongs, and wherein the known quantities or parametric values include power (P), torque (T), angular velocity (o>), voltage (V), current (I); and
   generating, using the derived estimate for the at least one unknown parametric value an executable lumped parameter model that represents the PMSM motor,
   wherein the executable lumped parameter model, when executed in a modeling environment running on the data processing system, simulates a behavior of the PMSM motor.

2. The method of claim 1 wherein the derived estimate for the at least one unknown parametric value include an estimate of at least one of 1) inductances, 2) a stator resistance ($R_s$), 3) a permanent magnetic flux ($\lambda_{pm}$), or 4) a rotor inertia (J).

3. The method of claim 1 further comprising:
   storing, at the data processing system, an executable model configured as a closed loop system, the executable model including a dynamic controller model and the lumped parameter motor model of the PMSM motor.

4. The method of claim 3 further comprising: executing the executable model by the modeling environment running on the data processing system to simulate a plant having the PMSM motor.

5. The method of claim 1 wherein the derived estimate for the at least one unknown parametric value is derived in a non-iterative manner.

6. The method of claim 1 further comprising:
   using the derived estimate for the at least one unknown parametric value in control of a physical plant including the PMSM motor.

7. The method of claim 1 further comprising:
   estimating an inverse of an executable model that includes the lumped parameter model of the PMSM motor using the derived estimate for the at least one unknown parametric value.

8. The method of claim 7 further comprising:
   realizing one or more adaptive control laws using the estimated inverse of the executable model that includes the lumped parameter model of the PMSM motor.

9. The method of the claim 1 further comprising:
   using one or more algorithms in the deriving the estimate for the at least one unknown parametric value for the PMSM motor; and
   generating code for one or more parts of the one or more algorithms used in the deriving the estimate for the at least one unknown parametric value for the PMSM motor.

10. The method of claim 9 further comprising:
    including the code generated for the one or more parts of the one or more algorithms into code of a controller.

11. The method of claim 1 wherein the deriving includes establishing the at least two known quantities or parametric values using assumptions relating to (i) mechanical constraints that form a first set of initial motor information and (ii) electrical constraints that form a second set of initial motor information.

12. The method of claim 11 wherein the assumptions relating to the mechanical constraints include:
    moving the PMSM motor at a load that requires the T; and
    spinning the PMSM motor at the ω to move the load within a time frame.

13. The method of claim 11 wherein the V is a bus V and the assumptions relating to the electrical constraints include:
    driving the PMSM motor with a power amplification system that delivers the bus V and the I to the PMSM motor.

14. The method of claim 11 further comprising:
    generating, based on the mechanical constraints and the electrical constraints, an estimate of a third set of initial motor information that includes an output power ($P_{out}$) parameter.

15. The method of claim 11 wherein the establishing the at least two known quantities includes obtaining the at least two known quantities or parametric values from at least one of a motor nameplate or a design requirement.

16. The method of claim 11 wherein the establishing the at least two known quantities or parametric values includes estimating an expected efficiency value (η) using National Electrical Manufacturers Association (NEMA) data pertaining to a selected class of motor.

17. The method of claim 1 wherein the deriving the estimates for the at least one unknown parametric value includes calculating one of the V and the current I using an empirically-obtained power factor.

18. The method of claim 2 wherein the inductances includes a d-axis inductance ($L_d$) and the deriving the estimate for the at least one unknown parametric value includes calculating the $L_d$ by assuming a ratio of the $L_d$ and a q-axis inductance ($L_q$).

19. The method of claim 2 wherein the deriving the estimate for the at least one unknown parametric value includes calculating the stator resistance ($R_s$) by assuming a stator loss of an empirically-obtained percentage of total losses.

20. The method of claim 2 wherein the deriving the estimate for the at least one unknown parametric value includes calculating the permanent magnetic flux ($\lambda_{pm}$) using a T equation.

21. The method of claim 2 wherein the deriving the estimate for the at least one unknown parametric value includes calculating the rotor inertia (J) by assuming a constant mass density of a rotor of the PMSM motor.

22. The method of claim 1 wherein the categories to which the at least one unknown parametric value and the at least two known quantities or parametric values belong include two or more of:
   operational quantities;
   design quantities;
   dynamic parameters;
   geometric parameters;
   performance parameters;
   behavioral parameters; or
   nameplate parameters.

23. A method comprising:
   generating, by a data processing system, first code for deriving estimates for unknown parametric values for a permanent magnet synchronous (PMSM) motor, wherein the generating includes
   using at least two known quantities or parametric values of the PMSM motor to calculate at least one of 1) inductances, 2) a stator resistance (Rs), 3) a permanent magnetic flux ($\lambda$pm), or 4) a rotor inertia (J), wherein the known quantities or parametric values include power (P), torque (T), angular velocity (co);
   providing, by the data processing system, the first code for inclusion into second code generated for a controller of the PMSM motor; and
   generating a lumped parameter model for the PMSM motor based on the derived estimates for the unknown parametric values for the PMSM motor, wherein
   the controller is represented by a controller model that interacts with the lumped parameter model, and
   the controller model and the lumped parameter model are included in an executable model that is executable.

24. The method of claim 23 further comprising: inversing the executable model.

25. A system comprising:
   One or more processor configured to:
   derive an estimate for at least one unknown parametric value for a permanent magnet synchronous (PMSM) motor based on at least two known quantities or parametric values of the PMSM motor, wherein the at least one unknown parametric value and the at least two known quantities or parametric values belong to categories and a first category to which the at least one unknown parametric value belongs is different than a second category to which the at least two known quantities or parametric values belongs, and wherein the known quantities or parametric values include power (P), torque (T), angular velocity (o>), voltage (V), current (I); and
   generate, using the derived estimate for the at least one unknown parametric value an executable lumped parameter model that represents the PMSM motor,
   wherein the executable lumped parameter model, when executed in a modeling environment, simulates a behavior of the PMSM motor.

26. The system of claim 25 wherein the derived estimate for the at least one unknown parametric value include an estimate of at least one of 1) inductances, 2) a stator resistance ($R_s$), 3) a permanent magnetic flux ($\lambda_{pm}$), or 4) a rotor inertia (J).

27. The system of claim 25 wherein the one or more processors are further configured to store an executable model configured as a closed loop system, the executable model including a dynamic controller model and the lumped parameter motor model of the PMSM motor.

28. The system of claim 27, wherein the one or more processors are further configured to execute the executable model by the modeling environment to simulate a plant having the PMSM motor.

29. The system of claim 25, wherein the one or more processors are further configured to use the derived estimate for the at least one unknown parametric value in control of a physical plant including the PMSM motor.

30. One or more non-transitory computer-readable media comprising program instructions, the program instructions when executed by a processor operable to:
   derive an estimate for at least one unknown parametric value for a permanent magnet synchronous (PMSM) motor based on at least two known quantities or parametric values of the PMSM motor, wherein the at least one unknown parametric value and the at least two known quantities or parametric values belong to categories and a first category to which the at least one unknown parametric value belongs is different than a second category to which the at least two known quantities or parametric values belongs, and wherein the known quantities or parametric values include power (P), torque (T), angular velocity (o>), voltage (V), current (I); and
   generate, using the derived estimate for the at least one unknown parametric value an executable lumped parameter model that represents the PMSM motor,
   wherein the executable lumped parameter model, when executed in a modeling environment, simulates a behavior of the PMSM motor.

31. The one or more non-transitory computer-readable media of claim 30 wherein the derived estimate for the at least one unknown parametric value include an estimate of at least one of 1) inductances, 2) a stator resistance ($R_s$), 3) a permanent magnetic flux ($\lambda_{pm}$), or 4) a rotor inertia (J).

32. The one or more non-transitory computer-readable media of claim 30, wherein the program instructions when executed by the processor further operable to store an executable model configured as a closed loop system, the executable model including a dynamic controller model and the lumped parameter motor model of the PMSM motor.

33. The one or more non-transitory computer-readable media of claim 32, wherein the program instructions when executed by the processor further operable to execute the executable model by the modeling environment to simulate a plant having the PMSM motor.

34. The one or more non-transitory computer-readable media of claim 30, wherein the program instructions when executed by the processor further operable to use the derived estimate for the at least one unknown parametric value in control of a physical plant including the PMSM motor.

* * * * *

UNITED STATES PATENT AND TRADEMARK OFFICE
CERTIFICATE OF CORRECTION

PATENT NO. : 10,725,440 B1
APPLICATION NO. : 15/443646
DATED : July 28, 2020
INVENTOR(S) : Grand et al.

It is certified that error appears in the above-identified patent and that said Letters Patent is hereby corrected as shown below:

In the Claims

Claim 3, Column 18, Line 5:
"the lumped parameter motor model of the PMSM"
Should read:
"the lumped parameter model of the PMSM"

Claim 17, Column 19, Line 3:
"includes calculating one of the V and the current I using an"
Should read:
"includes calculating one of the V and the I using an"

Claim 19, Column 19, Line 12:
"includes calculating the stator resistance (Rs) by assuming a"
Should read:
"includes calculating the Rs by assuming a"

Claim 20, Column 19, Line 17:
"includes calculating the permanent magnetic flux ($\lambda_{pm}$)"
Should read:
"includes calculating the $\lambda_{pm}$"

Claim 21, Column 19, Line 21:
"includes calculating the rotor inertia (J) by assuming a"
Should read:
"includes calculating the J by assuming a"

Claim 27, Column 20, Line 21:
"parameter motor model of the PMSM motor."

Signed and Sealed this
Second Day of March, 2021

Drew Hirshfeld
*Performing the Functions and Duties of the*
*Under Secretary of Commerce for Intellectual Property and*
*Director of the United States Patent and Trademark Office*

Should read:
"parameter model of the PMSM motor."

Claim 32, Column 20, Line 62:
"the lumped parameter motor model of the PMSM motor."
Should read:
"the lumped parameter model of the PMSM motor."